(12) United States Patent
Miura et al.

(10) Patent No.: US 7,095,699 B2
(45) Date of Patent: Aug. 22, 2006

(54) DETECTION APPARATUS, DETECTION METHOD AND ELECTRON BEAM IRRADIATION APPARATUS

(75) Inventors: Yoshihisa Miura, Kanagawa (JP); Yuichi Aki, Tokyo (JP)

(73) Assignee: Sony Corporation (JP)

( * ) Notice: Subject to any disclaimer, the term of this patent is extended or adjusted under 35 U.S.C. 154(b) by 503 days.

(21) Appl. No.: 10/410,179

(22) Filed: Apr. 10, 2003

(65) Prior Publication Data

US 2003/0202449 A1 Oct. 30, 2003

(30) Foreign Application Priority Data

Apr. 24, 2002 (JP) ................................. P2002-122966

(51) Int. Cl.
*G11B 7/00* (2006.01)

(52) U.S. Cl. .................... 369/101; 369/126; 250/441.11
(58) Field of Classification Search ................. 369/101, 369/126; 219/121.22; 250/441.11, 492.2, 250/492.3

See application file for complete search history.

(56) References Cited

U.S. PATENT DOCUMENTS 6,775,223 B1 * 8/2004 Eldredge et al. ............ 369/126

FOREIGN PATENT DOCUMENTS

| JP | 03-064089 | 10/1992 |
| JP | 10-215836 | 2/2000 |
| JP | 10-219232 | 2/2000 |

* cited by examiner

*Primary Examiner*—Nabil Hindi
(74) *Attorney, Agent, or Firm*—Rader, Fishman & Grauer PLLC; Ronald P. Kananen

(57) ABSTRACT

A detection apparatus, a detection method and an electron beam irradiation apparatus for detecting deflection electrons in order to precisely focus even if a vacuum seal valve is provided. An electron beam irradiation apparatus including a vacuum seal valve mechanism which is provided in a static pressure floating pad, and opens/closes an electron beam passage with a piston so as to switch between an electron beam irradiation state and a vacuum seal state, and a deflection electron detector which is provided between the vacuum seal valve mechanism and a master disk and detects a deflection electron signal generated from the master disk with electron beam irradiation.

9 Claims, 13 Drawing Sheets

A

B

DETECTION APPARATUS, DETECTION METHOD AND ELECTRON BEAM IRRADIATION APPARATUS

CROSS REFERENCE TO RELATED APPLICATIONS

The present document is based on Japanese Priority Application JP2002-122966, filed in the Japanese Patent Office on Apr. 24, 2002, the contents of which are incorporated herein by reference to the extent permitted by law.

BACKGROUND OF THE INVENTION

1. Field of the Invention

The present invention relates to a detection apparatus, a detection method, and an electron beam irradiation apparatus for detecting a signal for focusing an electron beam with which a master of an optical disk, for example, is prepared.

2. Related Art

In recent years, there has been a demand for an optical disk of increasingly higher recording density. In order to realize such a high recording density, it is necessary to form a smaller recording pit. As for preparation of a master of optical disk, earlier applications have been filed (Japanese patent application number H04-276068 and Japanese patent application number 2000-57374), in which electron beam irradiation apparatuses are proposed for recording information by irradiating a master disk with an electron beam capable of forming a finer pit than a conventional laser light.

In apparatuses for recording information by irradiating the master disk with an electron beam, grooves/lands, pits and the like having a width of a few to tens of nm may be formed. However, in order to record information with higher accuracy, it is necessary to accurately adjust an electron beam irradiation distance for suitable electron beam irradiation according to the distance between an electron beam irradiation head and the master disk.

For example, in a partial vacuum electron beam irradiation apparatus employing a differential static pressure floating pad such as the above-mentioned electron beam irradiation apparatus, positive pressure is applied to a static pressure bearing unit of the differential static pressure floating pad and negative pressure is applied so as to attract an exhaust unit, whereby the master disk and the differential static pressure floating pad are sticked in a contactless manner, keeping a gap of the order of µm so that a vacuum degree becomes higher in a position which is closer to the center of the differential static pressure floating pad. In this case, a vacuum degree that does not influence the irradiation with electron beams (approximately $1\times10^{-4}$ [Pa]) may be achieved at the center of the differential static pressure floating pad.

A conventional scanning electron microscope, as shown in FIG. 10, will be described as a general electron beam irradiation system and a general electron beam detection system.

The scanning electron microscope 100 includes a so-called electron beam column 101 and an electron beam irradiation head 106 maintaining a position facing a specimen 103 with a microscopic gap so as to permit electron beam irradiation. The specimen 103 is subject to irradiation with an electron beam 102 emitted from the electron beam irradiation head 106.

The electron beam column 101 includes an electron gun 111, a condenser electron lens 112 for condensing the electron beam 102 emitted from the electron gun 111, an electron beam modulator 113, a limiting plate 115 having an aperture 114 in its center, an electron beam deflector 116, a focus adjusting electron lens 117, and an objective electron lens 118.

The electron beam modulator 113 is formed of opposing deflection electrode plates, for example, across which a predetermined voltage is applied to deflect the electron beam 102, thereby causing the electron beam 102 to pass through the aperture 114 of the limiting plate 115 and to be intercepted by the limiting plate 115 so as to achieve ON/OFF modulation.

Further, the electron beam deflector 116 is formed of opposing deflection electrode plates, for example, such that a position of irradiation of the electron beam 102 may be finely moved in a radial direction on the specimen 103 or in a transversal direction in relation to tracks.

The focus adjusting electron lens 117 and the objective electron lens 118 each include an electromagnetic coil, which renders the electron beam 102 to go through the electron beam irradiation head 106 so as to focus on the specimen 103.

The focus adjusting electron lens 117 may be manually adjusted and held in a focus state. The focus adjusting electron lens 117 may be supplied with a focus error signal from a focus control unit, for example, so as to control the focus.

In addition, the electron beam 102 employed in the irradiation of the specimen 103 is deflected by an amount that depends on the shape of the surface of the specimen 103 and constitutive material thereof, so that a corresponding portion becomes deflection electrons 107. For example, the amount of the deflection electrons 107 may be determined by a semiconductor detector 108 mounted on the electron beam irradiation head 106. It should be noted that the semiconductor detector 108 includes, for example, a plurality of ring-shaped P-N junction semiconductor devices.

Further, as the electron beam irradiation requires a vacuum environment, the scanning electron microscope 100 employs a total vacuum system in which all components, such as the electron beam column 101, the electron beam irradiation head 106, the semiconductor detector 108 and a specimen chamber in which the specimen 103 is located are accommodated under vacuum condition.

An exhaust means of a vacuum pump (not shown) is connected to the electron beam column 101 and the exhaust means sucks air of the internal portion of the electron beam column 101, so that the inside portion of the electron beam column 101 is maintained at a vacuum degree ($1\times10^{-4}$ [Pa]) that does not influence the irradiation of electron beams.

The thus-constructed scanning electron microscope 100 operates as follows.

The electron beam 102 is emitted from the electron gun 111 of an electron beam energizer located at an upper portion of the electron beam column 101, which is mounted above the electron beam irradiation head 106.

The electron beam 102 emitted through the electron beam irradiation head 106 and reaching the specimen 103 shows three patterns of behavior, namely incidence of electrons into the specimen 103, transmission of part of the electrons, and deflection of the remaining. In this case, the semiconductor detector 108 determines an amount of absorption current caused by the incidence of electrons and the transmission of electrons and an amount of secondary electrons or deflection electrons bounced by the specimen 103 so as to obtain an observing image signal 121, of the specimen 103, processed by a signal processing circuit 119. Accordingly, the amount of signals corresponds to an image quality of the specimen 103, so that it is necessary to increase the amount of signals in order to improve image quality.

For example, the deflection electrons originating from the specimen 103 due to the electron beam irradiation start out upwardly at a deflection angle of 45° at one side, with respect to an axis of the electron beam. Since there is no blocking component above the specimen 103, the semiconductor detector 108 may be mounted at an end of the electron beam irradiation head 106 of the electron beam column 101 so as to capture a sufficient amount of deflection electrons to be determined. By using the focus adjusting electron lens 117, a sharp observing image needed to focus the electron beam may be obtained.

FIG. 11 is a schematic diagram showing the specimen and a deflection electron detector.

In FIG. 11, the deflection electrons 107 of the incident electron beam 102 to the specimen 103 are detected by divided semiconductor detectors 108A and 108B. Detected signals A and B detected by the semiconductor detectors 108A and 108B are amplified by amplifiers 122A and 122B, added (A+B) and subtracted from (A−B) by a processing unit 123 so as to obtain a composite image 124 and a rugged image 125. The amplifiers 122A and 122B and the processing unit 123 shown in FIG. 11 correspond to the signal processing circuit 119 shown in FIG. 10.

FIG. 12 is a cross-cross-sectional view showing an arrangement of a deflection electron detector in a conventional electron beam irradiation apparatus. In the conventional electron beam irradiation apparatus shown in FIG. 12, an electron beam irradiation opening 133 of a static pressure floating pad 131 is formed in a taper expanding towards an electron beam column 132 and at an angle of 45° at one side, so that a deflection electron detector 134 mounted at an end of the electron beam column 132 may sufficiently capture deflection electrons from a master disk 135.

On the other hand, besides the conventional electron beam irradiation apparatus, as described above, the applicant of the present invention filed, for example, another Japanese patent application No. 2002-50146 "ELECTRON BEAM IRRADIATION APPARATUS AND ELECTRON BEAM IRRADIATION METHOD". FIG. 13 is a cross-cross-sectional view showing an arrangement of a deflection electron detector in a conventional electron beam irradiation apparatus. As mentioned in the application, when replacing a master disk, it is necessary to retreat a static pressure floating pad from the master disk, which may cause several drawbacks, such as scattering of electron beams because of a decreased vacuum degree from the static pressure floating pad to an inside portion of the electron beam column. As shown in FIG. 13, a vacuum seal valve is illustrated. At an end portion of the static pressure floating pad 141, air is supplied via an air joint 147 against a resilience of a compression spring 146 so as to move a piston 145, close an electron beam irradiation opening 143, and thereby obtain a vacuum seal condition.

SUMMARY OF THE INVENTION

Accordingly, when the static pressure floating pad is retreated from the master disk, closing the vacuum seal valve causes the inside portion of the electron beam column to be maintained at a high vacuum degree. As a result, there is no necessity to block a vacuum system, such as the exhaust means, and an electron beam irradiation system, such as the electron gun, so that the latency caused as an unproductive time required for evacuation when starting the apparatus and stabilizing the electron beam may be reduced from a few hours to a few minutes. Further, the operability of disk replacement, maintenance, and operation time may be improved and the inside portion of the apparatus may be maintained at a high vacuum degree, thereby preventing contamination of the inside portion of the electron beam column and the inside portion of the static pressure floating pad by atmospheric pressure and extending the lifetime of the electron gun.

However, the above-described vacuum seal valve of the conventional electron beam irradiation apparatus, as shown in FIG. 13, supplies air via the air joint 147 against the resilience of the compression spring 146 at a end portion of the static pressure floating pad 141 so as to move the piston 145 in parallel with the master disk 148 and close the electron beam irradiation opening 143, thereby rendering the inside portion of the electron beam column 142 and the inside portion of the static pressure floating pad 141 to the vacuum seal condition.

Therefore, as mentioned above, considering only vacuum sealability by means of the vacuum seal valve for the inside portion of the electron beam column and the inside portion of the static pressure floating pad, a smaller diameter of the electron beam irradiation opening 143 is advantageous in terms of structure, so that the tapered electron beam irradiation opening 133, as shown in FIG. 12 is disadvantageous.

However, the smaller diameter of the electron beam irradiation opening 143 may mean a reduction in the amount of obtainable deflection electrons generated by the electron beam irradiation on a mark over a focus stage when focusing and also may mean a reduction in the amount of obtainable observing image signals caused by the electron beam irradiation of the master disk 148 when observing an image.

For example, in order to provide the above-mentioned piston 145 of the vacuum seal valve at the static pressure floating pad 141, a longitudinal center of the piston 145 should be approximately 6 mm high above an upper surface of the master disk 148 because of structural limitations, such as the necessary supply/evacuation mechanism, and the diameter of the piston 145.

In this case, assuming that the diameter of the electron beam irradiation opening 143 is 1 mm, as shown in FIG. 13, most of the deflection angle of the deflection electrons, of 45° at one side, is blocked by sidewalls within a through hole of the electron beam irradiation opening 143; therefore it can be seen that only a portion of the angle, for example, 3.81°, is effective in allowing the electron beam to pass through the through hole of the electron beam irradiation opening 143.

From this, only a blurred observing image can obtained, so that it is difficult at an event of focus adjustment to adjust the focus to be right in focus. In this way, the above-mentioned vacuum seal valve mounted within the static pressure floating pad 141 has a disadvantage of precluding detection of the deflection electrons required for adjustment of the focus by means of a conventional deflection electron detector 144, thus resulting in exposure being carried out under a defocused condition.

The present invention has been conceived in view of the above-mentioned problems and aims at providing a detection apparatus, a detection method, and an electron beam irradiation apparatus for detecting deflected electrons for fine adjustment of the focus even with a vacuum seal valve provided thereon.

A preferred embodiment of the present invention involves a detection apparatus including an electron beam irradiation head for permitting electron beam irradiation upon maintaining a position having a microscopic gap facing a recording medium; a securing and disposing means for securing and disposing the electron beam irradiation head emitting the electron beam by rendering the recording medium under partial vacuum; a movement means for moving the recording medium in a radial direction, a rotation means for rotating the recording medium when mounted on the movement means; a support means for horizontally mounting and supporting the recording medium when mounted on a rotating shaft of the rotation means; a focus table provided on a side of the support means for focusing the electron beam; a focus adjusting means for making a focus of the electron beam adjustable against the recording medium with the electron beam irradiation head opposing the focus table; and a static pressure floating pad provided in an electron beam passage on an end of the electron beam irradiation head; the detection apparatus detects a signal for focusing according to a change of shape or material of a surface of the recording medium caused by electron beam irradiation upon using the focus adjusting means, when linearly recording information on the recording medium supported to be movable in a rotational direction and in a radial direction.

Such detection apparatus preferably includes a vacuum seal switching means for switching between an electron beam irradiation state and a vacuum seal state by opening/closing the electron beam passage with a piston, the switching means provided in the static pressure floating pad; and a deflection electron detection means for detecting a deflection electron signal generated from the recording medium due to the electron beam irradiation, the detection means provided between the vacuum seal switching means and the recording medium.

Another preferred embodiment of the present invention relates to a detection method utilizing an electron beam irradiation head for permitting electron beam irradiation upon maintaining a position having a microscopic gap facing a recording medium; a securing and disposing means for securing and disposing the electron beam irradiation head emitting the electron beam by rendering the recording medium under partial vacuum; a movement means for moving the recording medium in a radial direction, a rotation means for rotating the recording medium when mounted on the movement means; a support means for horizontally mounting and supporting the recording medium when mounted on a rotating shaft of the rotation means; a focus table provided on a side of the support means for focusing the electron beam; a focus adjusting means for making a focus of the electron beam adjustable against the recording medium with the electron beam irradiation head opposing the focus table; and a static pressure floating pad provided in an electron beam passage on an end of the electron beam irradiation head; the detection method detects a signal for focusing according to a change of shape or material of a surface of the recording medium caused by electron beam irradiation upon using the focus adjusting means, when linearly recording information on the recording medium supported to be movable in a rotational direction and in a radial direction.

Such detection method preferably includes a vacuum seal switching step of switching between an electron beam irradiation state and a vacuum seal state by opening/closing the electron beam passage with a piston, the switching step provided in the static pressure floating pad; and a deflection electron detection step of detecting a deflection electron signal generated from the recording medium due to the electron beam irradiation, the detection step provided between the vacuum seal switching step and the recording medium.

An electron beam irradiation apparatus according to the present invention is applied to an electron beam irradiation apparatus including an electron beam irradiation head for permitting electron beam irradiation upon maintaining a position having a microscopic gap facing a recording medium; a securing and disposing means for securing and disposing the electron beam irradiation head emitting the electron beam by rendering the recording medium under partial vacuum; a movement means for moving the recording medium in a radial direction, a rotation means for rotating the recording medium when mounted on the movement means; a support means for horizontally mounting and supporting the recording medium when mounted on a rotating shaft of the rotation means; a focus table provided on a side of the support means for adjusting a height of the electron beam irradiation head and focusing the electron beam; a focus adjusting means for making a focus of the electron beam adjustable against the recording medium with the electron beam irradiation head opposing the focus table; and a static pressure floating pad provided in an electron beam passage on an end of the electron beam irradiation head; the apparatus detects a signal for focusing according to a change of shape or material of a surface of the recording medium caused by electron beam irradiation upon using the focus adjusting means, when linearly recording information on the recording medium supported to be movable in a rotational direction and in a radial direction.

Such electron beam irradiation apparatus preferably includes a vacuum seal switching means for switching between an electron beam irradiation state and a vacuum seal state by opening/closing the electron beam passage with a piston, the switching means provided in the static pressure floating pad; and a deflection electron detection means for detecting a deflection electron signal generated from the recording medium due to the electron beam irradiation, the detection means provided between the vacuum seal switching means and the recording medium.

Accordingly, the preferred embodiments of the present invention provide the following operations.

At first, initialization is carried out. Before starting up vacuumization, there is a gap between the static pressure floating pad and the master disk, and the static pressure floating pad does not apply any pressure to the master disk. In this condition, a reset to the zero (0) point is carried out on the surface of the master disk.

Then the vacuumization is started up. For vacuumization, when starting up the apparatus, the static pressure floating pad tends to be pulled up to a vacuum chamber side in a direction away from the master disk.

The vacuum seal switching means is provided in the static pressure floating pad and opens/closes the electron beam passage with the piston so as to switch between an electron beam irradiation condition and a vacuum seal condition. The vacuum seal switching means switches to the vacuum seal condition when exchanging the master disks and moving the electron beam irradiation means, and switches to the electron beam irradiation condition when focusing and exposing the master disk to it.

After the vacuum seal switching means switches to the vacuum seal condition, the electron beam irradiation means is moved. After switching to the electron beam irradiation condition, focusing is carried out. As the movement means moves in a radial direction of the master disk, the electron beam irradiation means is opposed to the focus stage, and then the surface of the master disk is irradiated with the electron beam by means of electromagnetic coils of the focus adjusting electron lens and the objective electron lens of the electron beam column through the electron beam irradiation means.

The deflection electron detection means is provided between the vacuum seal switching means and the master disk so as to detect deflection electron signals generated from the focus stage due to the electron beam irradiation. Since the deflection electrons from the master disk are not intercepted until they are captured by the deflection electron detection means, most of the deflection electrons within the deflection angle are captured by the deflection electron detector. Based on the deflection electron signals detected by the deflection electron detection means, focusing on the surface of the master disk is carried out so as to focus on a right focal point.

After the vacuum seal switching means switches to the vacuum seal condition, the electron beam irradiation means is moved. After switching to the electron beam irradiation condition, exposure is carried out. The static pressure floating pad at a lower end of the electron beam irradiation means sticks to the master disk in a contactless manner with a small gap, wherein the master disk is irradiated, in focus, with the electron beam emitted from the electron gun through the electron beam passage in the center of the static pressure floating pad. Further, rotational movement by the above-mentioned rotation means and linear movement by the movement means allow continuous exposure from the inner periphery to the outer periphery of the master disk. In other words, the master disk is irradiated with the electron beam in a condition where part of the surface of the master disk is vacuumized by the static pressure floating pad, and at the same time the master disk is rotated by the drive force of the rotation means and the master disk is moved in a radial direction by the drive force of the movement means, thus recording information on a predetermined linear track.

The detection apparatus according to the present invention includes a detection apparatus having an electron beam irradiation head for permitting electron beam irradiation upon maintaining a position having a microscopic gap facing a recording medium; a securing and disposing means for securing and disposing the electron beam irradiation head emitting the electron beam by rendering the recording medium under partial vacuum; a movement means for moving the recording medium in a radial direction, a rotation means for rotating the recording medium when mounted on the movement means; a support means for horizontally mounting and supporting the recording medium when mounted on a rotating shaft of the rotation means; a focus table provided on a side of the support means for focusing the electron beam; a focus adjusting means for making a focus of the electron beam adjustable against the recording medium with the electron beam irradiation head opposing the focus table; and a static pressure floating pad provided in an electron beam passage on an end of the electron beam irradiation head; the detection apparatus detectes a signal for focusing according to a change of shape or material of a surface of the recording medium caused by electron beam irradiation upon using the focus adjusting means, when linearly recording information on the recording medium supported to be movable in a rotational direction and in a radial direction. Such detection apparatus preferably includes a vacuum seal switching means for switching between an electron beam irradiation state and a vacuum seal state by opening/closing the electron beam passage with a piston, the switching means provided in the static pressure floating pad; and a deflection electron detection means for detecting a deflection electron signal generated from the recording medium due to the electron beam irradiation, the detection means provided between the vacuum seal switching means and the recording medium. As a result, the detection apparatus according to the preferred embodiment of the present invention has advantages in that the deflection electron detector is provided at the lower end of the vacuum seal switching means in the static pressure floating pad, so that the deflection electron detection means may approach the recording medium, thereby reducing the working distance, not damaging the vacuum sealing by the vacuum seal switching means, capturing a sufficient amount of deflection electrons by intensifying the deflection electrons, and precisely detecting the deflection electrons.

In addition, as described above, the detection apparatus according to the present invention may have an advantage in that the deflection electron detection means is provided with the cover for covering the coating of the signal wire for extracting the detected deflection electron signal, so that deflected electrons are prevented from being stored at the coating of the end on the deflection electron detection means side of the signal wires, thus improving the accuracy of detected signals.

Moreover, as described above, the detection apparatus according to the present invention may provide an advantage that, a terminal is provided to connect the signal wire for extracting the detected deflection electron signal from the deflection electron detection means with the signal processing means outside the static pressure floating pad, and the vacuum sealing condition inside the static pressure floating pad is maintained so as to obtain a sufficient amount of deflection electrons, whereby the accuracy of detected signals may be improved.

Furthermore, the detection method including the steps as mentioned above may have advantages in that the deflection electron detector is provided at the lower end of the vacuum seal valve in the static pressure floating pad, so that the deflection electron detector may approach the recording medium, thereby reducing the working distance, not damaging the vacuum sealing by the vacuum seal valve, capturing a sufficient amount of deflection electrons by intensifying the deflection electrons, and precisely detecting the deflection electrons.

Also, as described above, the detection method according to the present invention may provide an advantage that the detection in the deflection electron detecting step is carried out after switching from the vacuum seal condition to the electron beam irradiation condition in the vacuum seal switching step, so that after the electron beam irradiation means for exchanging master disks and focusing is moved, while maintaining the vacuum condition, the deflection electron detector may detect a sufficient amount of deflection electrons.

In addition, the electron beam irradiation apparatus according to the present invention including the elements as described above may have the following advantages:

(1) the deflection electron detector is provided at a lower end of the vacuum seal switching means in the differential static pressure floating pad, so that the deflection electron detector may approach the recording medium, thereby reducing the working distance, not damaging the vacuum sealing by the vacuum seal switching means, capturing a sufficient amount of deflection electrons by intensifying the deflection electrons, and precisely detecting the deflection electrons;

(2) since the deflection electrons are precisely detected, focusing of the electron beam prior to exposure and astigmatism adjusting may be easily achieved;

(3) based on the sharp observing image, it is possible to adjust the focus on the right focal point;

(4) a sufficient amount of deflection electrons maybe obtained, so that the diameter of the electron beam may be reduced, thus increasing the life of the electron gun; and (5) the diameter of the electron beam may be reduced, so that a higher recording density may be achieved by exposing a finer pattern.

Furthermore, as described above, the electron beam irradiation apparatus according to the present invention may provide advantages in that the deflection electron detection means is provided with a cover for covering the coating of the signal wire for extracting the detected deflection electron signal, so that deflected electrons are prevented from being stored at the insulation coating of the end on the deflection electron detection means side of the signal wires, thus improving the accuracy of detection by detected signals, and a sharp observing image necessary for focusing without effects from deflected electrons may be obtained from deflection electron detection signals detected by the deflection electron detection means.

As described above, the electron beam irradiation apparatus according to the present invention includes a terminal for connecting the signal wire for extracting the deflection electron signal detected by the deflection electron detection means to the signal processing means outside the static pressure floating pad, while maintaining a vacuum in the static pressure floating pad, so that the vacuum sealing condition inside the static pressure floating pad is maintained so as to obtain a sufficient amount of deflection electrons. Thus, the accuracy of detected signals is improved, so that the deflection electron detection signal may be employed to obtain the sharp observing image necessary for focusing.

BRIEF DESCRIPTION OF THE DRAWINGS

The above and other objects, features and advantages of the present invention will become more apparent to those skilled in the art from the following description of the presently preferred exemplary embodiments of the invention taken in conjunction with the accompanying drawings, in which:

FIG. 4A and FIG. 4B schematically show a deflected electron detector, wherein FIG. 4A is a cross-sectional view and FIG. 4B is a bottom view, according to a preferred embodiment of the present invention;

FIG. 5A and FIG. 5B schematically show the current introducing terminal, wherein FIG. 5A is a cross-sectional view and FIG. 5B is a side view, according to a preferred embodiment of the present invention;

FIG. 6A and FIG. 6B show a perspective view of a charge preventing cover, wherein FIG. 6A shows an oval-shaped cover and FIG. 6B shows a circular-shaped cover according to a preferred embodiment of the present invention;

DESCRIPTION OF THE PREFERRED EMBODIMENTS

A preferred embodiment of the present invention is described below, with reference to the accompanying drawings.

Figure 1:
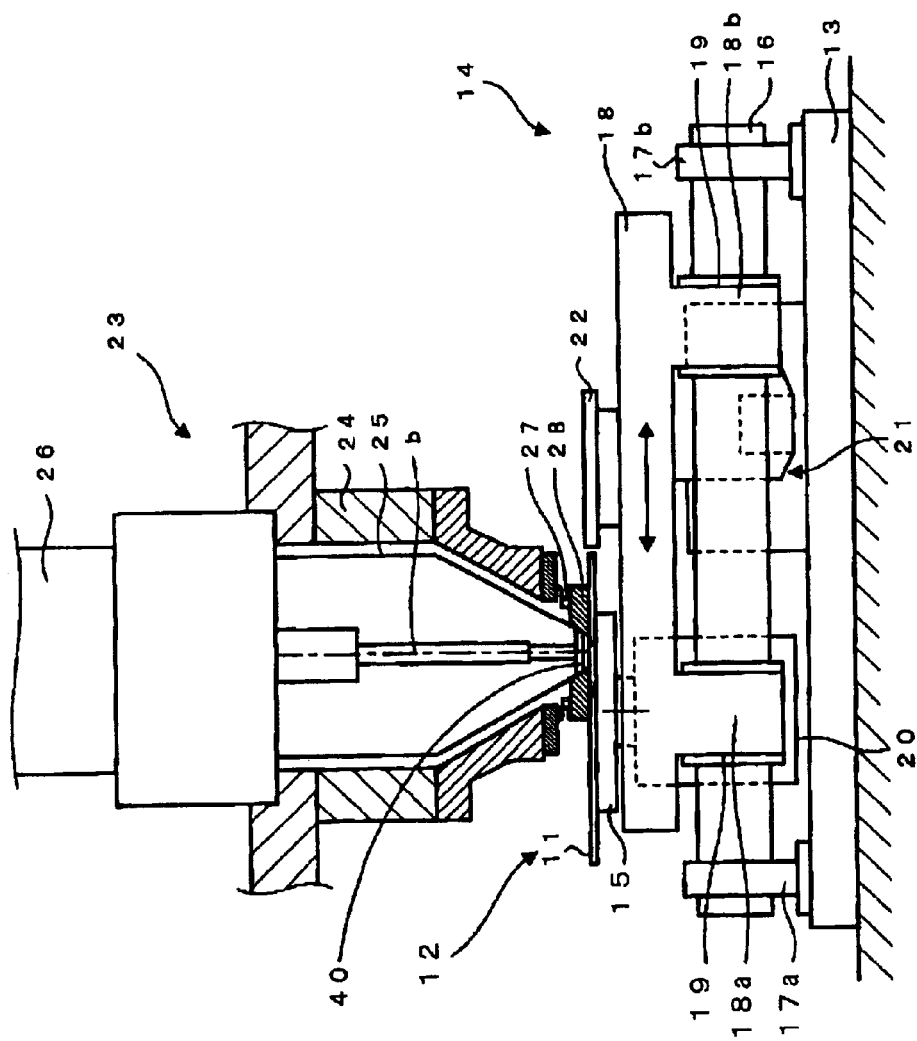
FIG. 1 is a schematic cross sectional view showing a construction of an electron beam irradiation apparatus, according to a preferred embodiment of the present invention.

An electron beam irradiation apparatus for pattern exposure carried out by means of an electron beam representation for a photoresist layer applied onto a glass substrate when preparing a master disk for a stamper for manufacturing an optical disk is shown as an example of preferred embodiment of the present invention. As shown in FIG. 1, the apparatus records a signal (forms recording pits of a signal pattern) on a recording medium of a master disk 11, which is a receiver of an electron beam b emitted from a electron gun 26.

The electron beam irradiation apparatus includes a so-called electron beam column 25, an electron beam irradiation means 23 that includes an electron beam irradiation head maintaining a position facing a master disk 11 with a microscopic gap so as to permit electron beam irradiation, a focus stage 22 for controlling focusing, the master disk 11 subject to irradiation by an electron beam b emitted from the electron beam irradiation means 23, and a spindle motor 20 and a movable table 18 which support the master disk 11 movable in a rotational direction and a radial direction.

Further, the electron beam column 25 includes the electron gun 26, a condenser electron lens (not shown) for condensing the electron beam b emitted from the electron gun 26, an electron beam modulator, a limiting plate having an aperture in the center, an electron lens for adjusting the focus of the electron beam b, an objective electron lens, and an electron beam deflector for deflecting the irradiation direction of the electron beam b.

The electron beam modulator includes opposing deflection electrode plates, for example, across which a predetermined voltage is applied so as to deflect the electron beam b, thereby causing the electron beam b to pass through the aperture of the limiting plate and to be intercepted by the limiting plate so as to achieve ON/OFF modulation.

Further, the electron beam deflector includes opposing deflection electrode plates, for example, such that the position of irradiation of the electron beam may be finely moved in a transversal direction in relation to tracks on a radial direction of the master disk 11.

The focus adjusting electron lens and the objective electron lens, respectively, include electromagnetic coils which render the electron beam b to go through the electron beam irradiation means 23, so as to focus on the master disk 11.

The focus adjusting electron lens may be manually adjusted and held in a focus state. The focus adjusting electron lens may be supplied with a focus-error signal from a focus-control unit, for example, so as to control the focus.

The electron beam irradiation needs a vacuum environment. In particular, the apparatus employs a partial vacuum system in which only a part for the electron beam irradiation is under a vacuum condition and the rest is exposed to atmosphere.

First, a support mechanism unit 12 for supporting the master disk 11 in the apparatus will be described.

The support mechanism unit 12 includes a base 13 secured on a frame of the apparatus, a linear guide mechanism 14 provided on the base 13, and a spinning table 15 supported by the linear guide mechanism 14 to be linearly movable and carrying the master disk 11 thereon.

The linear guide mechanism 14 includes a guide rail 16 disposed over and in parallel with the base 13, stands 17a and 17b for holding both right and left ends of the guide rail 16 at the base 13, and the movable table 18 supported to be movable along the guide rail 16. The movable table 18 is held at bearings 19 of a static air pressure type, for example, provided at right and left legs 18a and 18b of the movable table 18 so as to be movable along the guide rail 16.

The spinning table 15 is provided on the movable table 18 of the linear guide mechanism 14 and rotably supported by a bearing of a static pressure type with low friction, for example.

The master disk 11 is stuck and secured on the spinning table 15 so as to be mounted in a horizontal position. As for a means for sticking the master disk 11 to the spinning table 15, a vacuum stick system or an electrostatic stick system may be suitably employed.

The spinning table 15 is rotated by the electromagnetic type spindle motor 20 disposed thereunder. Further, under the spinning table 15 there is provided an encoder for detecting rotation. The encoder and a control circuit control the rotation and drive of the spinning table 15.

Further, between the movable table 18 and the base 13, there is provided a linear motor 21 of an electromagnetic drive type, which drives the movable table 18 to move along the guide rail 16 in parallel, that is, in a radial direction, of the master disk 11. Although not shown in the figure, the linear guide mechanism 14 is provided with a linear scale for detecting the position of the movable table 18 and a drive control mechanism for feeding back the value of the linear scale by means of a control circuit so as to position the movable table 18.

Above the thus-constructed support mechanism unit 12 for supporting the master disk, the electron beam irradiation means 23 for electron beam irradiation in a partial vacuum condition on the master disk 11 is fixedly positioned.

A vacuum chamber 24 is suspended above the master disk 11. The electron beam column 25 is disposed inside the vacuum chamber 24. The electron beam b is emitted from the electron gun, the electron beam energizer, at the upper portion of the electron beam column 25.

An exhaust means including a vacuum pump (not shown) is connected to the vacuum chamber 24 in which the electron beam column 25 is accommodated, and the exhaust means sucks inside air of the vacuum chamber 24 so that the inside portion of the electron beam column 25 is maintained at a vacuum degree ($1 \times 10^{-4}$ [Pa]) that does not influence the irradiation with electron beams.

A static pressure floating pad 28 is attached to an electron beam outlet opening of a lower end of the vacuum chamber 24 via an expansion and contraction link mechanism 27. The static pressure floating pad 28 sticks to the master disk 11 in a contactless manner with a gap of approximately 5 μm, wherein the master disk 11 is irradiated with the electron beam b emitted from the electron gun 26 through an electron beam passage in the center of the static pressure floating pad 28. As will be described, a deflection electron detector 40 for detecting a deflection electron of the electron beam b with which the master disk 11 is irradiated is disposed at an end of the electron beam passage in the center of the static pressure floating pad 28.

Figure 2:
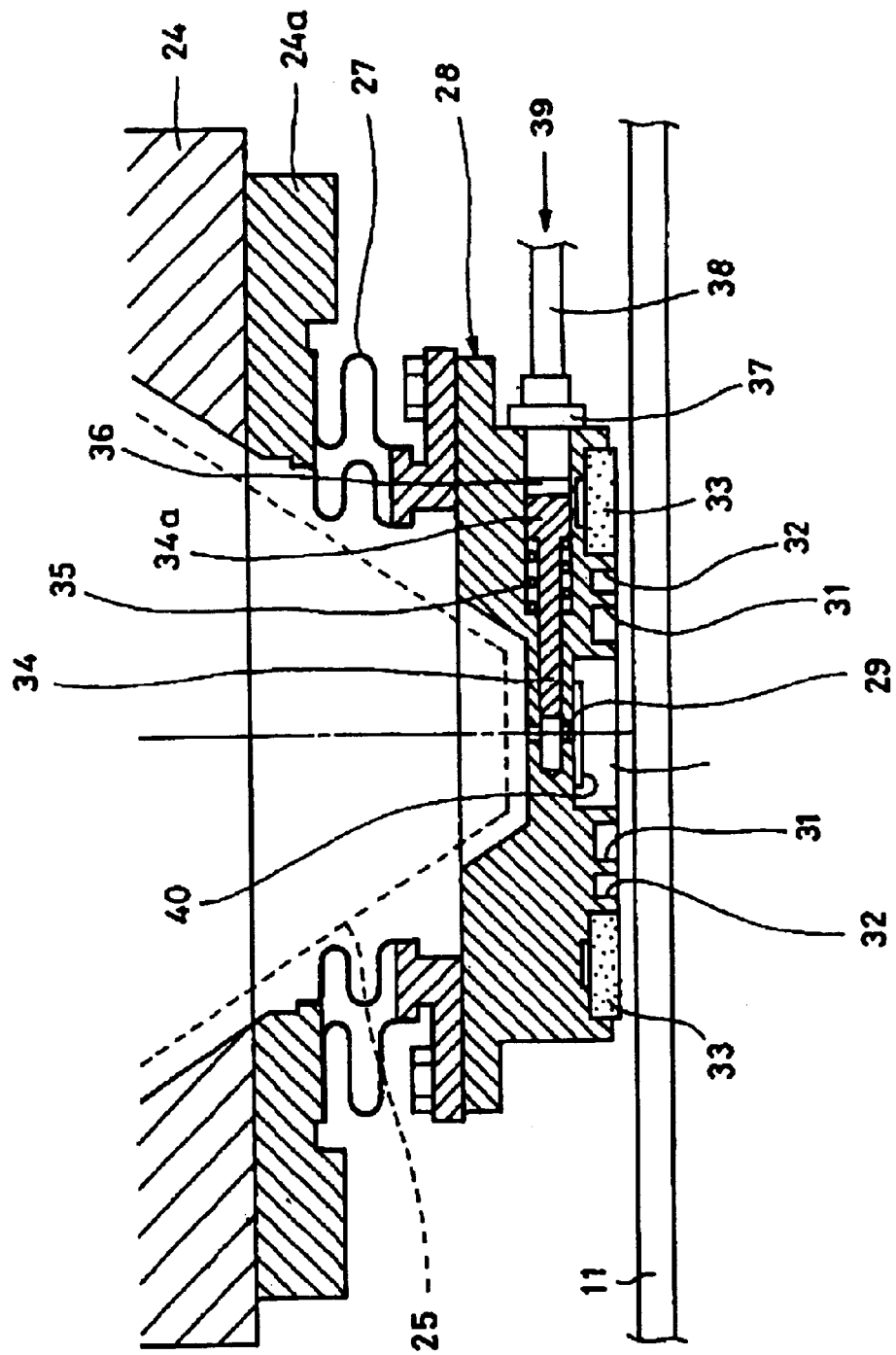
FIG. 2 is a schematic cross sectional view showing a portion of the electron beam irradiation apparatus, according to a preferred embodiment of the present invention.

In FIG. 2 there is shown a detailed structure of the static pressure floating pad 28.

In the center of the static pressure floating pad 28, there is formed of a block made of a metal, for example, the electron beam passage 29 through which the electron beam b passes. The static pressure floating pad 28 is air-tightly communicated with a securing portion 24a of an end of the vacuum chamber 24 by means of the bellows-shaped expansion and contraction link mechanism 27. Expansion or contraction of the expansion and contraction link mechanism 27 allows the static pressure floating pad 28 to follow the master disk 11 so as to stick to it, even if it has unevenness in thickness or rotational vibrations.

As a means for sticking the static pressure floating pad 28 to the master disk 11, there is formed at the static pressure floating pad 28 a first suction groove 31 and a second suction groove 32, each opening facing the master disk 11 and being coaxial with respect to the electron beam passage 29.

The first suction groove 31 and the second suction groove 32 are each connected to the exhaust means via an exhaust pipe (not shown). The exhaust means permits exhaustion, i.e., air-suction from the first suction groove 31 and the second suction groove 32.

Vacuum pumps are employed as the exhaust means. A suction groove closer to the electron beam passage 29 is connected with a vacuum pump providing a higher vacuum degree in exhaustion. For example, the first suction groove 31 closer to the electron beam passage 29 is connected with a vacuum pump providing a vacuum degree to the extent of obtaining approximately $1 \times 10^{-1}$ [Pa], and the outer and second suction groove 32 is connected to a vacuum pump of a vacuum degree to the extent of obtaining approximately $5 \times 10^3$ [Pa].

Further, on the static pressure floating pad 28, an air-permeable member 33 is secured outside the second suction groove 32 to face the master disk 11. The air-permeable member 33 is formed of a permeable and porous metal material and in a ring-shape centered on the electron beam passage 29. An air passage is formed on the backside of the air-permeable member 33 and inside the static pressure floating pad 28.

The passage is communicated, via an air supply pipe with a compression air supply that is a air supply means through which compressed air (of positive pressure) of approximately $5 \times 10^5$ [Pa] is supplied and blown out of the air-permeable member 33.

In the electron beam irradiation apparatus of the partial vacuum system, when replacing the master disk 11, the exhaustion or air suction from the first suction groove 31 and the second suction groove 32 of the static pressure floating pad 28 is stopped so as to retreat the static pressure floating pad 28 from the master disk 11 in a radial direction or upwards.

When the static pressure floating pad 28 comes off the master disk 11, in order to prevent the atmosphere from flowing inside the vacuum chamber 24 through the electron beam passage 29 of the static pressure floating pad 28, the electron beam irradiation apparatus is arranged to have a vacuum seal valve mechanism inside the static pressure floating pad 28.

The vacuum seal valve mechanism will be described in detail with reference to FIG. 2.

Figure 3:
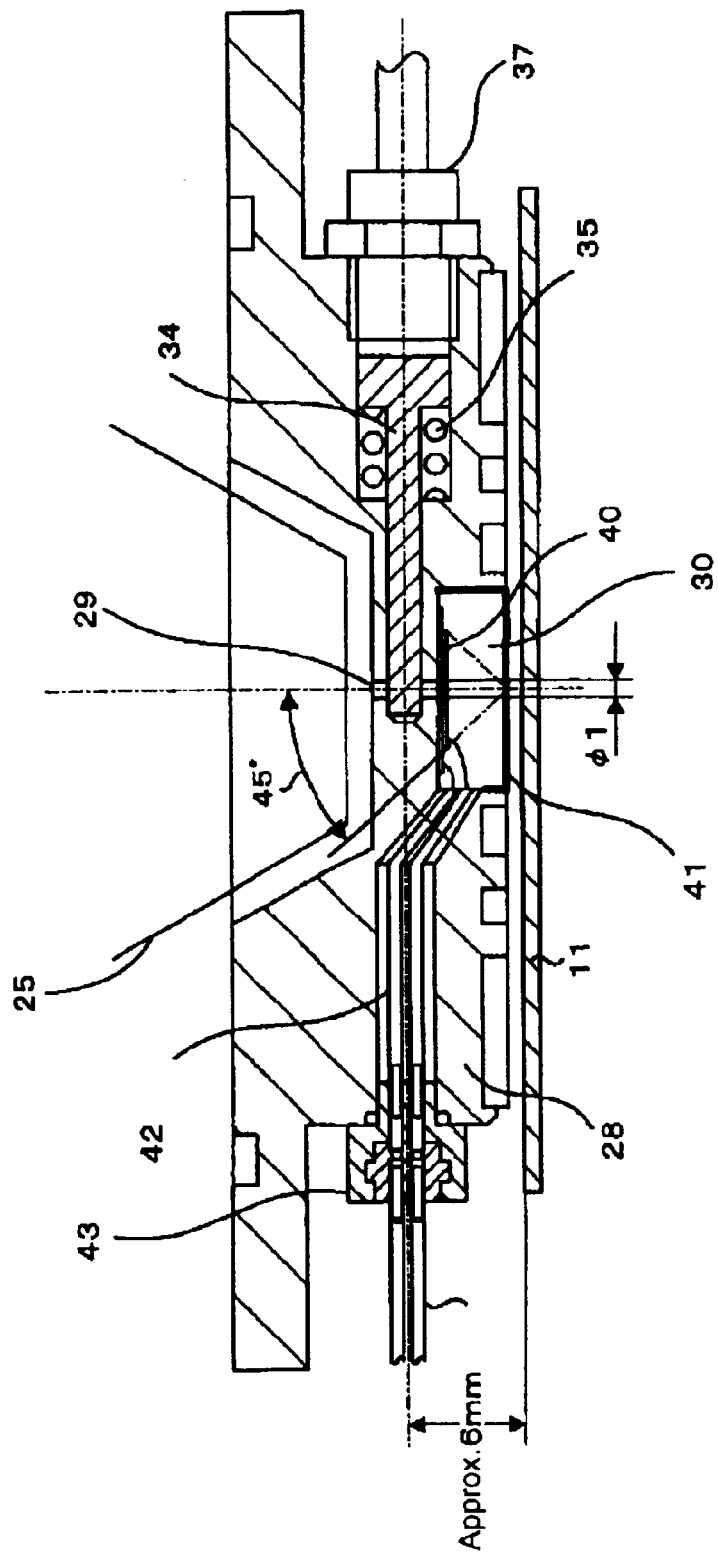
FIG. 3 is a schematic cross sectional view showing an arrangement of a deflection electron detector and a current introducing terminal, according to a preferred embodiment of the present invention.

The vacuum seal valve including a piston 34 is incorporated in the static pressure floating pad 28, being orthogonal to the electron beam passage 29 so as to slide right and left (as in FIG. 3).

The piston 34 constituting the vacuum seal valve includes a bar-shaped member circular in cross-section, as will be described hereafter, so that the electron beam passage 29 is opened/closed as the piston 34 moves.

As an operating means for the piston 34, there is provided an air cylinder portion 36 within the static pressure floating pad 28. A base portion 34a of the piston 34 is slidably engaged with the air cylinder portion 36 without a gap. The outside of the air cylinder portion 36 is connected, via an air joint 37 and the air supply pipe 38 to the air supply means 39 having an air pump, so that the air supply mean supplies the air cylinder portion 36 with compression air so as to push the piston 34 inwardly.

Further, a compression coil spring 35 is incorporated in the air cylinder portion 36. The elastic force of the spring 35 provides the piston 34 with retreating force.

In the usual condition or a state where the compression air is not supplied by the air supply means, the piston 34 is in a retreated position away from the electron beam passage 29 due to the repulsive force of the spring 35. Therefore, the electron beam passage 29 is in an open state where the electron beam irradiation is carried out.

When the static pressure floating pad 28 is retreated, upon supplying compression air from the air supply means, the piston 34 is pushed back against the repulsive force of the spring 35 so as to move forward and block the electron beam passage 29. In this situation, the master disk is replaced, the electron beam irradiation means 23, which is the electron beam irradiation head for focusing, is moved.

As a result, the electron beam passage 29 is closed to achieve vacuum seal, that is to say, in this situation, the atmosphere is not allowed to enter the vacuum chamber 24 including the electron beam passage 29, the static pressure floating pad 28, and the electron beam columns 25.

Next, with reference to FIG. 2, there is described a configuration of the deflection electron detector in a situation where the above-mentioned vacuum seal valve mechanism is provided.

A circular recess 30 is formed on a surface, facing the master disk 11, on an inner peripheral side of the first suction groove in the center portion of the static pressure floating pad 28. On the ceiling portion of the recess 30, the deflection electron detector 40 for detecting the deflection electrons of the electron beam b with which the master disk is irradiated is disposed by securing with an adhesive, etc. while maintaining electric insulation. The depth or the distance from the opening to the ceiling portion of the recess 30 is approximately 4 mm, for example. The depth of the recess 30 is determined considering the above-mentioned angle of 45° at one side, which is are treating angle of the deflection electrons from an upper surface of the master disk 11. There is no element to intercept electrons between the master disk 11 and the deflection electron detector 40, so that it is possible to capture a sufficient number of deflection electrons.

At this event, assuming that the longitudinal center of the piston 34 is approximately 6 mm high above the master disk 11 and that the diameter of the piston 34 is 2 mm, the thinnest portions of the static pressure floating pad 28 above and below the piston 34 each remain as thick as approximately 1 mm, thus being sufficient to be subject to high precision processing for mounting the deflection electron detector 40.

FIG. 3 is a cross-sectional view showing an arrangement of the deflection electron detector and a current introducing terminal.

Figure 10:
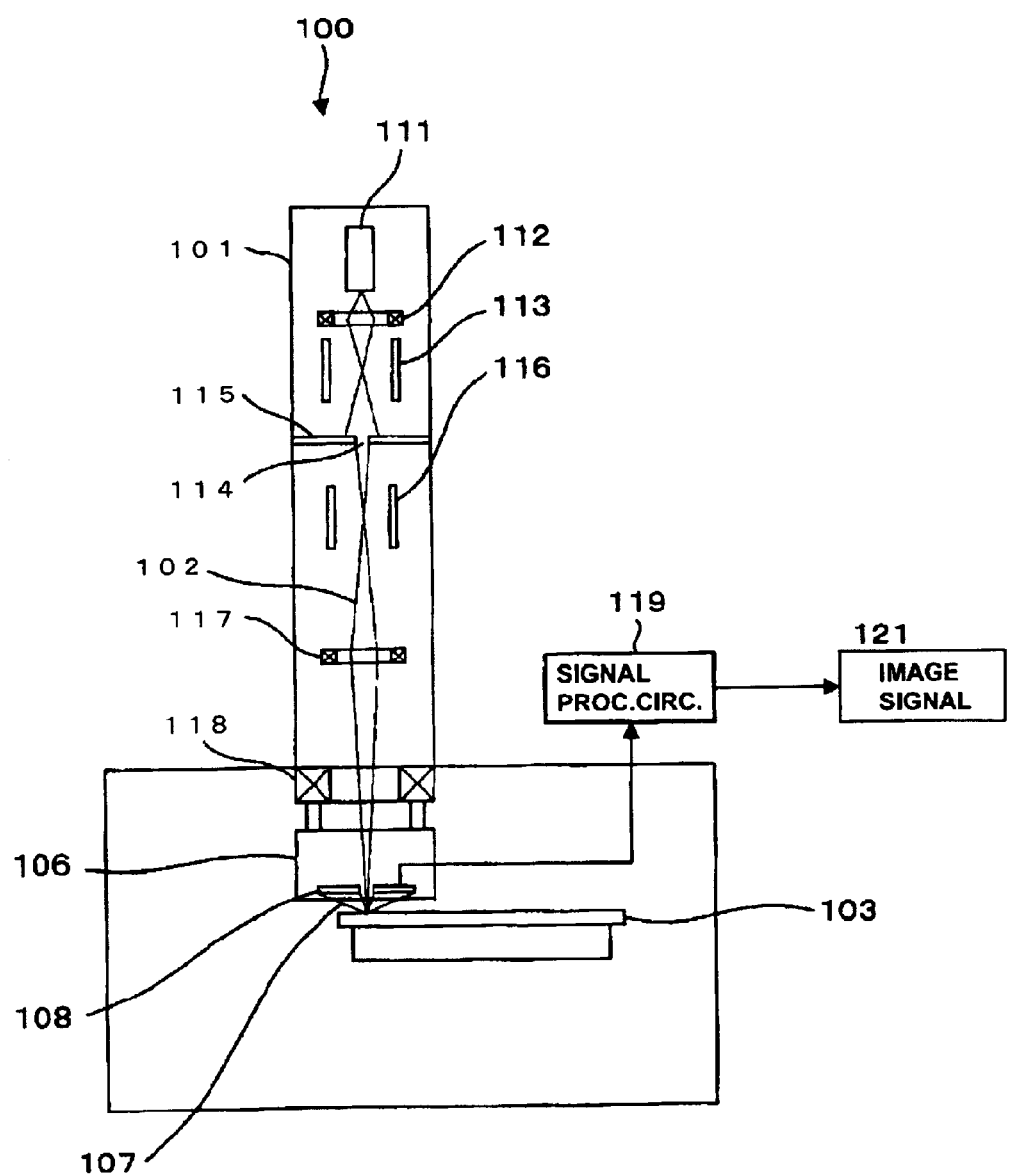
FIG. 10 is view showing a structure of a conventional scanning electron microscope.
Figure 11:
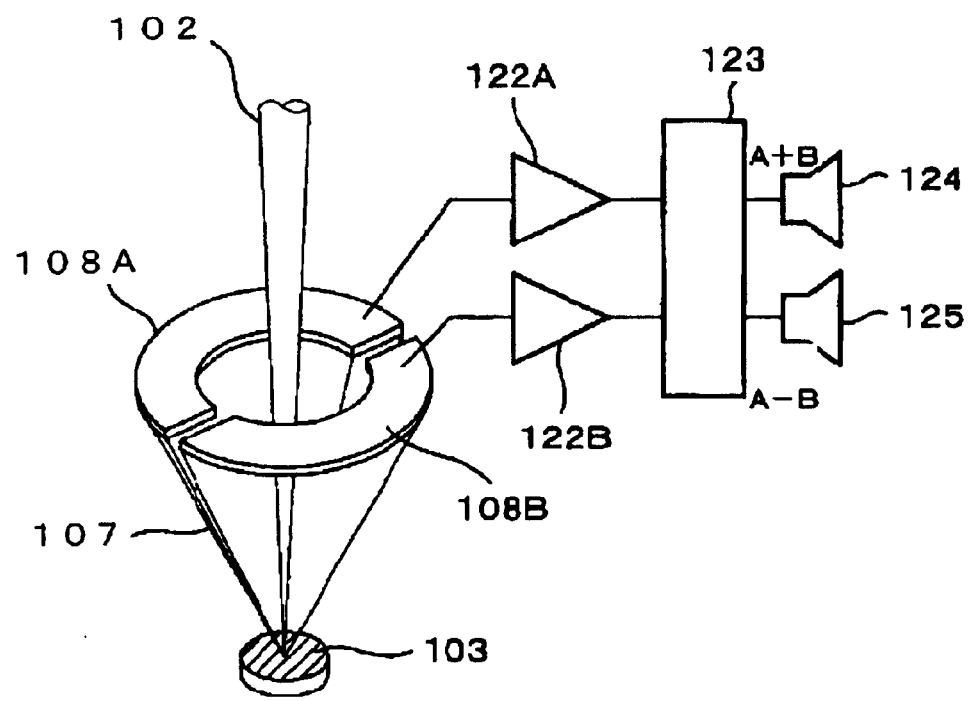
FIG. 11 is a schematic diagram showing a conventional specimen and a deflection electron detector.
Figure 12:
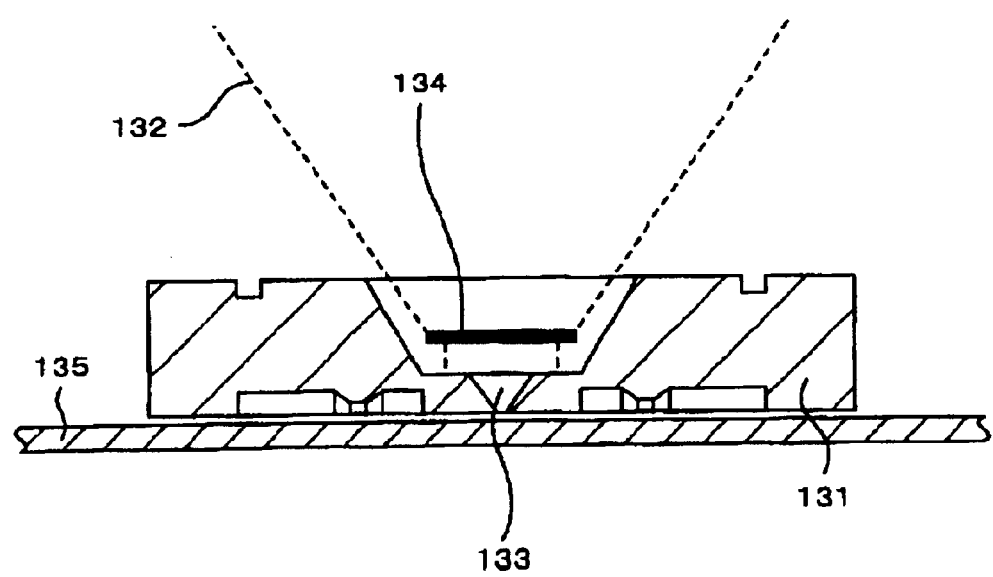
FIG. 12 is a cross-cross-sectional view showing an arrangement of a conventional deflection electron detector.
Figure 13:
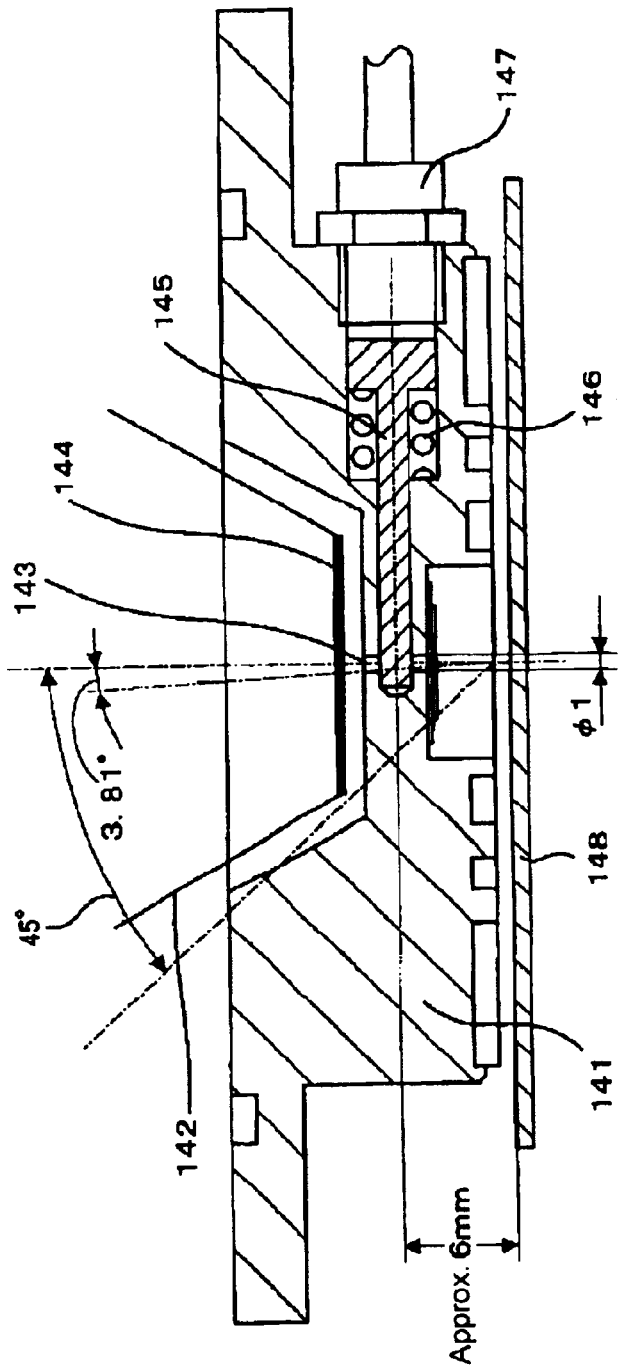
FIG. 13 is a cross-cross-sectional view showing another arrangement of a conventional deflection electron detector.

A weak detection signal detected by the deflection electron detector 40 is supplied to the signal processing circuit 119, as shown in FIG. 10 and disposed outside the static pressure floating pad 28, and then processed to generate an image signal. The image signal is supplied to a display so as to display an observing image on the display. The signal processing circuit 119 shown in FIG. 10 corresponds to the amplifiers 122A, 122B and the processing unit 123 as shown in FIG. 11.

The inside portion of the static pressure floating pad 28 near the deflection electron detector 40 is at a high vacuum degree, such as approximately $1 \times 10^{-3}$ [Pa]. While maintaining a vacuum ranging from the high vacuum degree to the atmosphere outside the static pressure floating pad 28 such as $5 \times 10^5$ [Pa], the current introducing terminal 43 for obtaining the weak detection signal detected by the deflection electron detector 40 is mounted on an end opposite the above-mentioned vacuum seal valve mechanism via a through hole within the static pressure floating pad 28 from the recess 30 to the outside of the static pressure floating pad 28.

The weak detection signal detected by the deflection electron detector 40 is obtained from the inside portion of the static pressure floating pad 28 through a signal wire 42 disposed in the through hole (starting at the recess 30) within the static pressure floating pad 28, and the signal is once relayed by the current introducing terminal 43. With rendering the inside portion of the static pressure floating pad 28 to be in a vacuum seal condition so as to maintain the above-mentioned vacuum condition, the current introducing terminal 43 supplies the detection signal to the signal processing circuit 119, as shown in FIG. 10, by means of a signal wire 44.

An end of the signal wire 42 in the recess 30 leaves part of an insulation coating on the deflection electron detector 40 side for insulating from the static pressure floating pad 28. According to the electron beam b with which the master disk 11 is irradiated, besides the deflection electrons, a variety of deflected electrons, such as secondary electrons emitted based on an incident electron beam, Auger electrons having a specific energy inherent to an element, X-rays in some cases, etc., are generated. When the deflected electrons are stored at the insulation coating of the signal wire 42 at the end on the deflection electron detector 40 side, a disturbance may take place in an image signal generated by the signal processing circuit 119 shown in FIG. 10. If the image signal is supplied to the display, an unclear observing image causing some distortion, such as an irregular flow, a flicker, etc., is displayed on the display. Therefore, a sharp observing image necessary for focusing may not be displayed.

In order to avoid blurred images, a charge-preventing cover 41 made of a metal and having a hole allowing at least the electron beam b to pass therethrough and not obstructing the angle of the reflection electrons of 45° at one side is secured with an electro-conductive adhesive, such as a silver paste, so that the deflected electrons may not be stored or charged at the insulation coating of the end of the signal wire 42 in the recess 30 on the deflection electron detector 40. The charge preventing cover 41 may be formed of a non-magnetic metal, such as brass or aluminum, for example, with nickel plated thereon of tens of micrometers in thickness.

Figure 6:
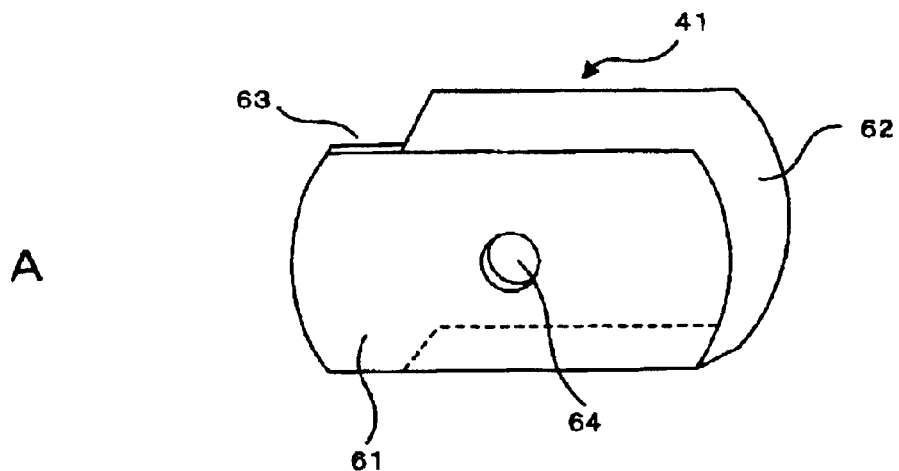
Figure 6:
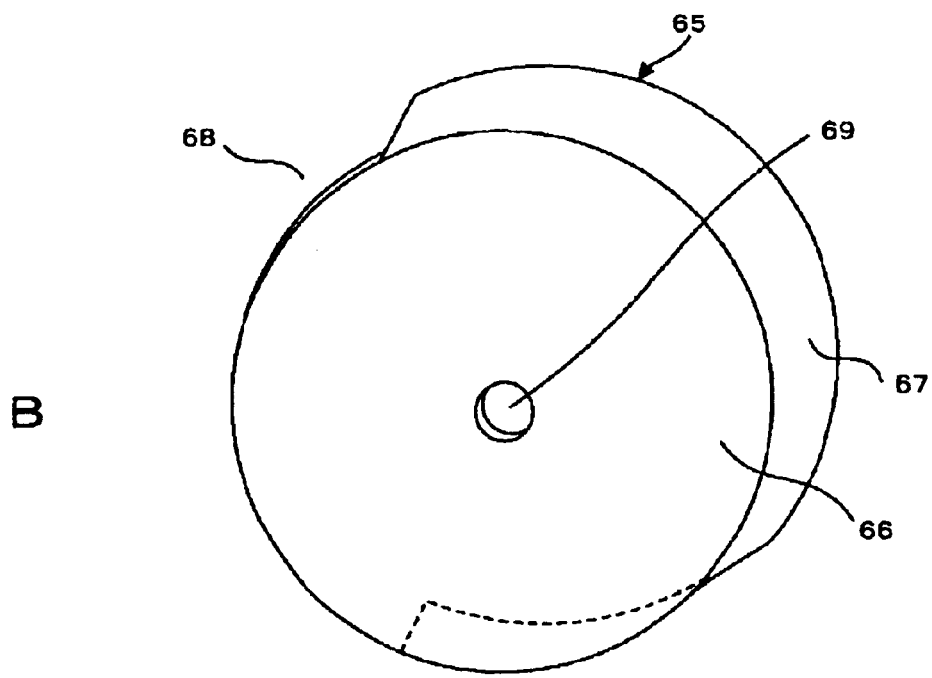

FIG. 6 shows the charge preventing covers, in which FIG. 6A illustrates one in oval shape, and FIG. 6B shows another in circular shape. The charge preventing cover is formed according to the shape of the deflection electron detector 40.

In FIG. 6A, the oval-shaped charge preventing cover 41 has a hole 64 at its bottom 61, accommodated within the recess 30 in terms of diameter, and allowing at least the electron beam b to pass therethrough and not obstructing the deflection angle of the deflection electrons, of 45° at one side. The oval-shaped charge preventing cover 41 covers the deflection electron detector 40 of an oval shape and has a covering portion 62 of a depth fitting in the depth of the recess 30. The oval-shaped charge preventing cover 41 has an opening portion 63 so as to cover the insulation coating of the end of the signal wire 42 in the recess 30 on the deflection electron detector 40 side of the oval shape.

In FIG. 6B, the circular charge preventing cover 65 has a hole 69 at its bottom portion 66, which can be accommodated in the recess 30 in terms of its diameter. The hole 69 at least allows the electron beam b to pass therethrough and does not obstruct the deflection angle of the deflection electrons, of 45° at one side. Further, the circular charge preventing cover 65 covers the circular deflection electron detector 40 and has a covering portion 67 of a depth fitting in the depth of the recess 30. The circular charge preventing cover 65 has an opening portion 68 so as to cover the insulation coating of the end of the signal wire 42 in the recess 30 on the deflection electron detector 40 side of the oval shape.

Figure 4:
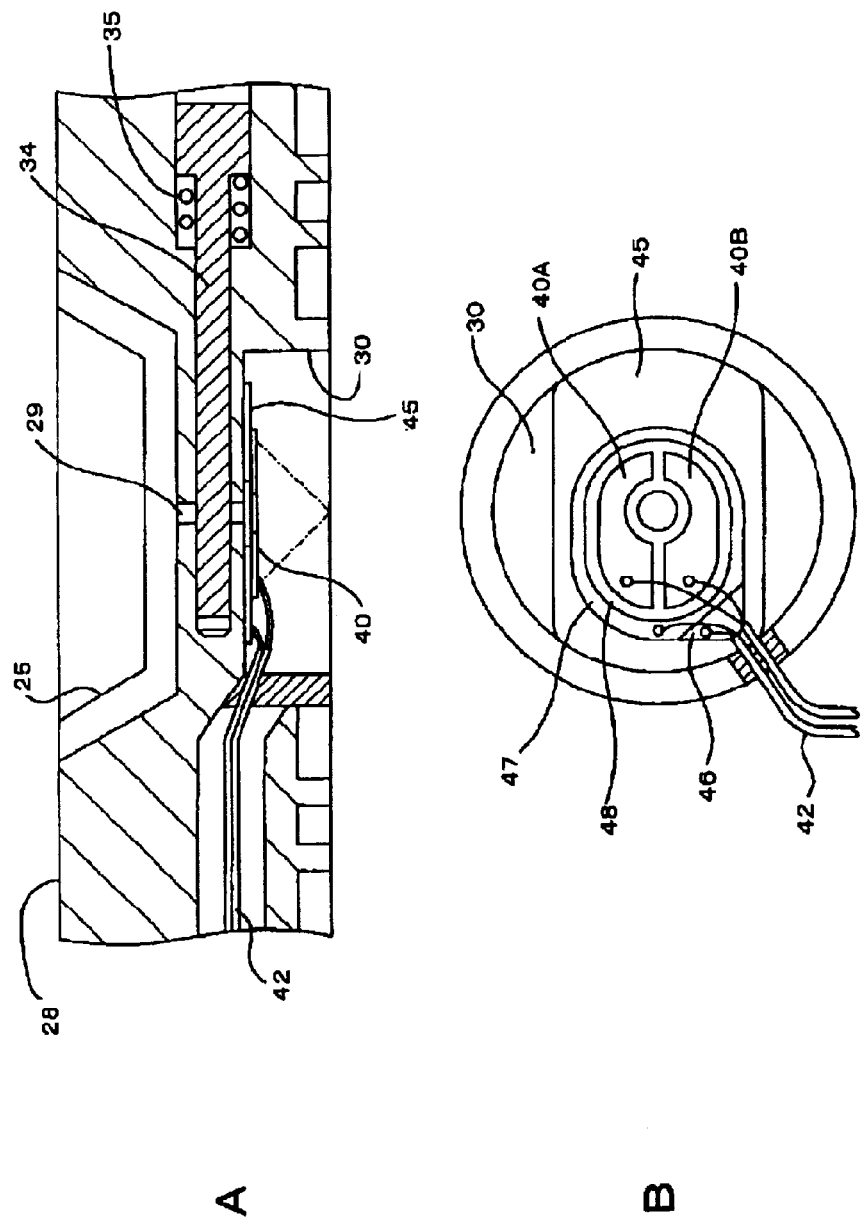

FIG. 4 shows the deflection electron detector, in which FIG. 4A is a cross-sectional view and FIG. 4B is a bottom view. FIG. 4 shows the deflection electron detector in a condition where the charge preventing cover 41 is taken away.

As shown in FIG. 4A, the ceiling portion of the circular recess 30 is formed at the surface, facing the master disk 11, on the inner peripheral side of the first suction groove in the center portion of the static pressure floating pad 28. On the ceiling portion of the recess 30, the deflection electron detector 40 for detecting the deflection electrons of the electron beam b with which the master disk 11 is irradiated, maintaining the deflection angle of 45° at one side, is disposed by securing with an adhesive, etc. while maintaining electric insulation.

As shown in FIG. 4B, a substrate 45 is disposed in the circular recess 30 while maintaining electric insulation. On the substrate 45 there are provided a ground plate 46 for preventing a possible noise in a detected signal and a signal ground plate 47. An insulation sheet 48 is disposed on the signal ground plate 47. Two separated or bipartitioned semiconductor detectors A, B of the deflection electron detector 40 are provided on the insulation sheet 48. The separation direction of the semiconductor detectors A, B of the deflection electron detector 40 corresponds to a transversal direction in relation to information tracks recorded on the master disk 11.

Two detected signals of the semiconductor detectors A, B of the deflection electron detector 40, grounded from the ground plate 46, and signal grounded from the signal ground plate 47 are conductively connected to four signal wires 42.

As a result, by preventing deflected electrons from being stored at the insulation coating of an end on the deflection electron detector 40 side, the accuracy of detected signals may be improved. The detected signal may be employed to display a sharp observing image necessary for focusing on the display.

Figure 5:
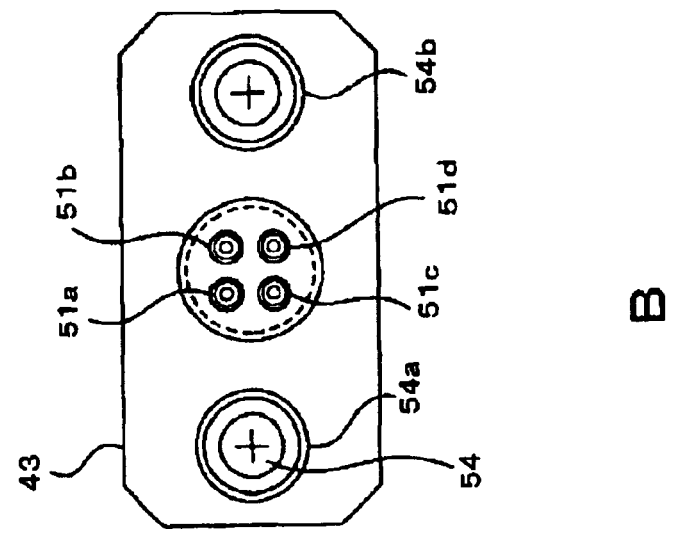
Figure 5:
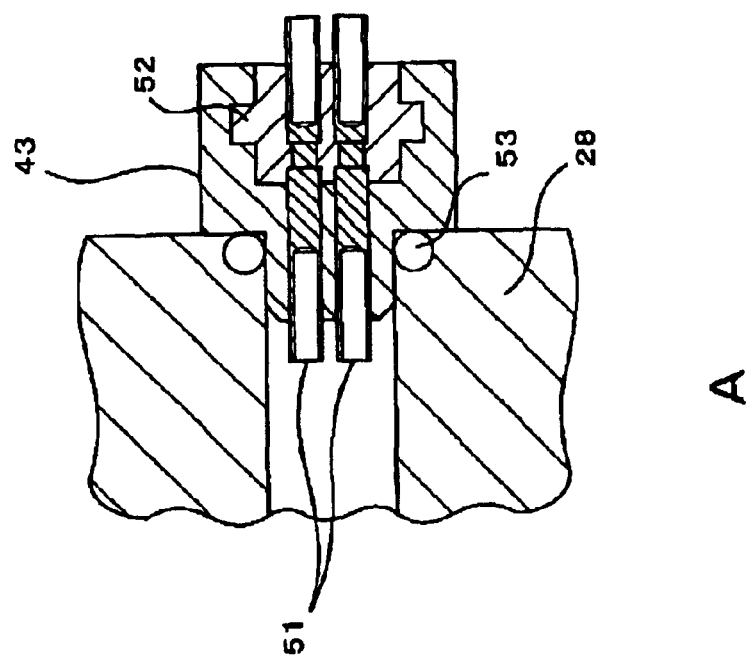

FIG. 5 shows the current introducing terminal, in which FIG. 5A is a cross-sectional view and FIG. 5B is a side view thereof.

Figure 7:
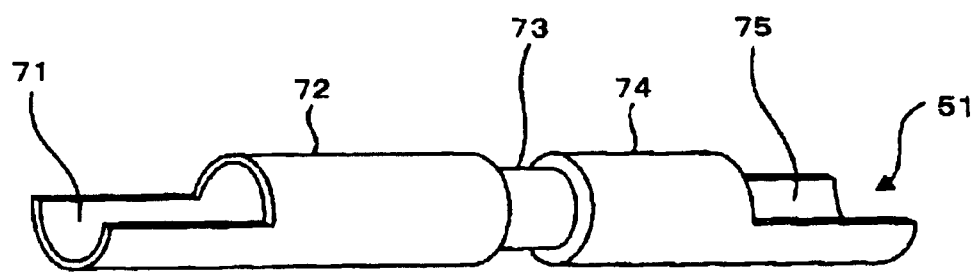
FIG. 7 is a perspective view showing a pin, according to a preferred embodiment of the present invention.
Figure 8:
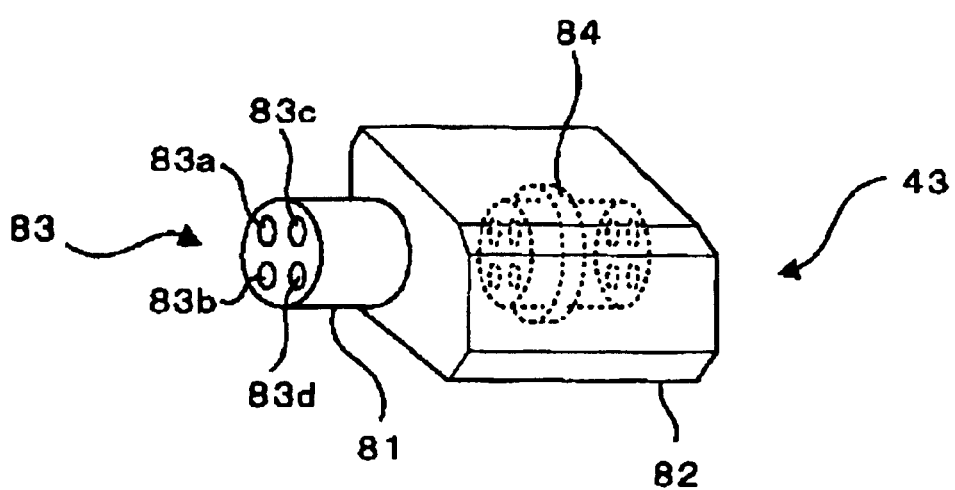
FIG. 8 is a perspective view showing a current introducing terminal, according to a preferred embodiment of the present invention.
Figure 9:
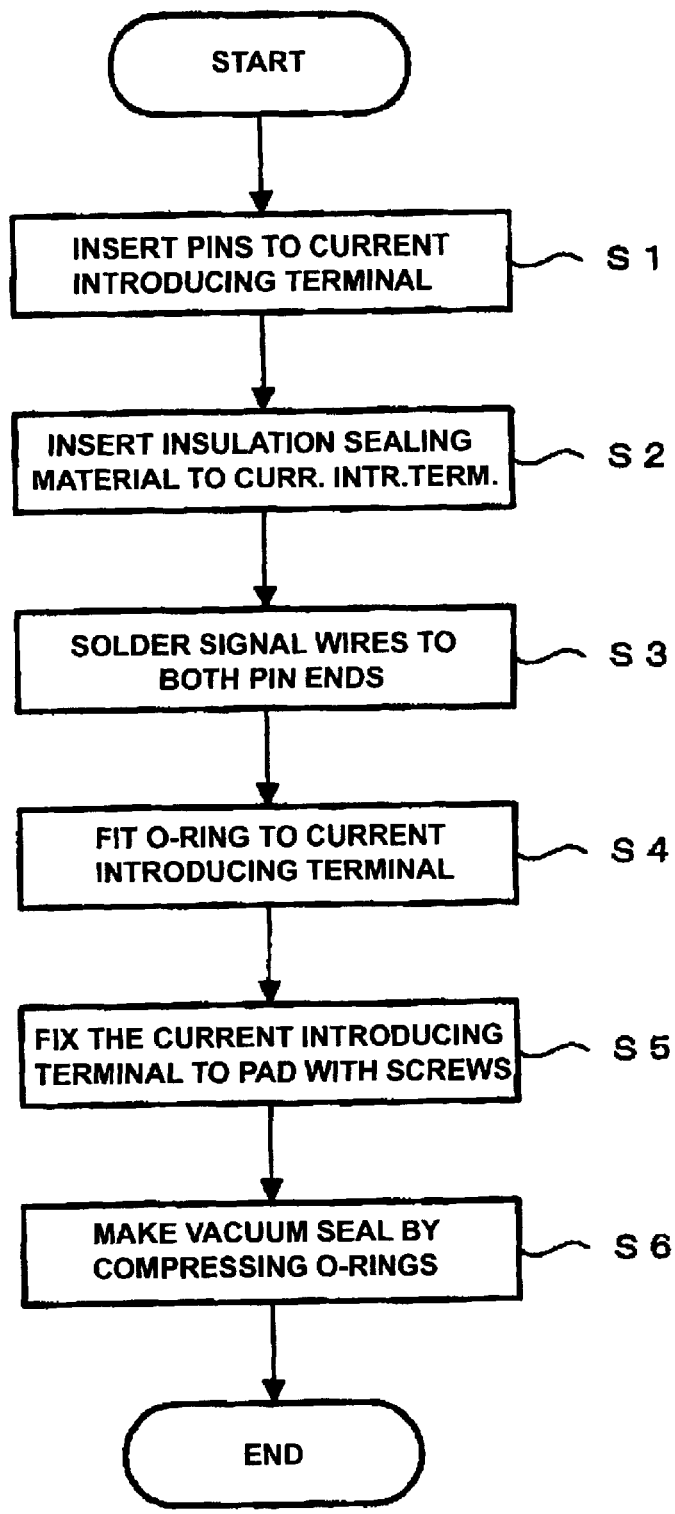
FIG. 9 is a flow chart showing a procedure of vacuum sealing using a current introducing terminal, according to a preferred embodiment of the present invention.

FIG. 7 is a perspective view showing a pin. FIG. 8 is a perspective view showing the current introducing terminal. FIG. 9 is a flow chart showing a procedure of vacuum sealing by means of the current introducing terminal.

As shown in FIG. 5A, the current introducing terminal 43 body is formed of a ceramic material, for example. In step S1, as shown in FIG. 9, four pins, as shown in FIG. 7, and made of a conductive material such as brass, are inserted into four holes 83a, 83b, 83c, 83d of the current introducing terminal 43, as shown in FIG. 8.

Further, the current introducing terminal 43 has a cylindrical space 84 for a sealing material, the space having a flange or a ring-shaped groove at the center of the inner periphery, as shown in FIG. 8. In step S2, for the sealing material, an insulation sealing material 52 is injected by a syringe into the space 84 of the current introducing terminal 43, and then cured to be formed integrally.

During the process, a projecting portion of the cured insulation sealing material 52 functions as a stopper and prevents the insulation sealing material 52 from removing from the current introducing terminal 43. The cured insulation sealing material 52 entered in a recessed portion 74 formed between a projecting portion 72 and a projecting portion 73 of the pin 51, as shown in FIG. 7, functions as a stopper and prevents the pin 51 from moving from the insulation sealing material 52. Therefore, the current introducing terminal 43 is vacuum sealed, and the pin 51 does not move from the current introducing terminal 43.

As a result, the current introducing terminal 43 may maintain a vacuum sealing condition inside the static pressure floating pad 28, so as to obtain a sufficient amount of deflection electrons, so that the accuracy of detected signals maybe improved. The detected signal may be employed to display a sharp observing image necessary for focusing on the display.

In step S3, as shown in FIG. 9, soldering portions 71, 75 at both ends of the pin 51, as shown in FIG. 7, are soldered to signal wires. In order to improve the so-called leakage of solder and to cause the solder to flow into the soldering portions 71, 75 of the pin 51, respectively in contact with the signal wires 42, 44, the pin 51 is of brass plated with 0.1 μm thick gold and with a 2 μm thick nickel plating as a primer.

In step S4, as shown in FIG. 9, a columnar portion 81, of the current introducing terminal 43 body, as shown in FIG. 8, is fitted with an O-ring 53. In step S5, as shown in FIG. 9, the current introducing terminal 43 body is secured to the static pressure floating pad 28 with fixing screws 54a, 54b, as shown in FIG. 5B, during which in step S6, as shown in FIG. 9, the O-ring 53 is compressed to provide vacuum sealing between the static pressure floating pad 28 and the current introducing terminal 43 body.

The thus-constructed electron beam irradiation apparatus operates as follows.

The electron beam b is emitted from the electron gun 26 of an electron beam energizer located at an upper portion of the electron beam column 25, which is mounted above the electron beam irradiation means 23.

The static pressure floating pad 28 is attached to the electron beam outlet opening of the lower end of the electron beam irradiation means 23 via the expansion and contraction link mechanism 27. The static pressure floating pad 28 floats in a contactless manner with a small gap of approximately 5 μm between the master disk 11, wherein the master disk 11 is irradiated with the electron beam b emitted from the electron gun 26 through the electron beam passage in the center of the static pressure floating pad 28.

When the thus-constructed static pressure floating pad 28 is placed on the master disk 11 and each exhaust means and the compression air supply which is the air supply means are operated, the air blown out of the air permeable member 33 causes the static pressure floating pad 28 to float slightly over the master disk 11, and at the same time air is sucked from the first and second suction groove 31 and 32 to cause negative pressure in the grooves, so that the static pressure floating pad 28 acts as if it adhered to the master disk 11 by suction, whereby the static pressure floating pad 28 sticks to the master disk 11 in a contactless manner with a gap d of approximately 5 μm and does not obstruct the rotation of the master disk 11.

At this event, the air blown out of the air-permeable member 33 is sucked by the first and second suction grooves 31 and 32 formed there approximately so as to avoid reaching the electron beam passage 29. The air from the air-permeable member 33 is firstly sucked by the second suction groove 32 and then sucked by the first suction groove 31. Since suction force by the first suction groove 31 is stronger than that of the second suction groove 32, the closer to the center of the static pressure floating pad 28 a position is, the higher the vacuum degree is provided, whereby the inside portion of the vacuum chamber 24, that is, the inside portion of the electron beam column 25, is maintained at a vacuum degree ($1\times10^{-4}$ [Pa]) to the extent of not affecting the electron beam irradiation.

Then the static pressure floating pad 28 causes part of the upper surface of the master disk 11 to be in a substantial vacuum condition, and the master disk 11 is irradiated with the electron beam b. At the same time the master disk 11 is rotated by drive force from the spindle motor 20. The drive force of the movable table 18 moves the master disk 11 in a radial direction, so as to record information on a predetermined linear track.

An operation of detection of a deflection electron of the thus constructed electron beam irradiation apparatus will be described hereafter.

At first, initialization is carried out. In particular, before starting up the vacuum process, compressed air is not applied to the expansion and contraction link mechanism 27, so that at atmospheric pressure, there is a gap between the static pressure floating pad 28 and the master disk 11. In a state where the static pressure floating pad 28 does not apply any pressure to the master disk 11, on the upper surface of the master disk 11, there is positioned a probe of an electric micrometer capable of carrying out fine position detection so as to reset to the zero (0) point. The electric micrometer is an apparatus for electrically detecting a displacement of a contact point of a contact-type detecting probe and amplifying the displacement signal so as to measure the displacement precisely. Usually, a differential-transformer type is utilized, in which a core and the probe are connected together to determine the displacement. Some electric micrometers are of a capacitance-type, in which a change of a gap between electrodes of a capacitor, some are of piezoelectric-type in which a piezoelectric element is employed, and some are of a resistance-type in which a wire resistance strain gauge, is employed. In this case, on initialization, the master disk does not rotate, so that a contact type electric micrometer is used to reset a reference on the upper surface of the master disk to the zero (0) point.

Next, the vacuumization process is started up. Specifically, regarding the differential static pressure floating pad 28, for the vacuumization at the event of starting up the apparatus, the expansion and contraction link mechanism 27 receives a contraction force corresponding to the product of an effective sectional area of the inner bellows of the double bellows of the expansion and contraction link mechanism 27 and a negative pressure of minus one (−1) atmosphere, so that the static pressure floating pad 28 tends to be pulled up towards the vacuum chamber 24 side in a direction that goes away from the master disk 11. At this event, in order that the reference zero (0) of the upper surface of the master disk is not changed, positive pressure is applied between the double bellows of the expansion and contraction link mechanism 27 so as to balance with the pulling up force.

Next, an operation of the vacuum seal valve mechanism is described below.

The vacuum seal valve mechanism is provided in the static pressure floating pad 28 and opens/closes the electron beam passage 29 with the piston 34 so as to switch between an electron beam b irradiation condition and a vacuum seal condition. The vacuum seal valve mechanism switches to the vacuum seal condition when exchanging the master disks 11 and moving the electron beam irradiation means 23, and switches to the electron beam b irradiation condition when focusing and exposing.

After the vacuum seal valve mechanism switches to the vacuum seal condition, the electron beam irradiation means 23 is moved, and after switching to the electron beam b irradiation condition, the focusing process is carried out. Specically, as the movable table 18 moves in a radial direction of the master disk 11, the electron beam irradiation means 23 is opposed to the focus stage 22, and then the surface of the master disk 11 is irradiated with the electron beam b by means of electromagnetic coils of the focus adjusting electron lens and the objective electron lens of the electron beam column 25 through the electron beam irradiation means 23.

At this event, the deflection electron detector 40 is provided between the piston 34 of the vacuum seal valve mechanism and the master disk 11 so as to detect deflection electron signals generated from the focus stage 22 due to the electron beam b irradiation. Since the deflection electrons from the master disk 11 are never intercepted until they are captured by the deflection electron detector 40, most of the deflection electrons within the deflection angle are captured by the deflection electron detector 40. Based on the deflection electron signals detected by the deflection electron detector 40, focusing on the surface of the master disk 11 is carried out so as to focus on a right focal point.

As a result, after the electron beam irradiation means 23, which is the electron beam irradiation head for exchanging master disks and focusing, is moved, the deflection electron detector 40 may detect a sufficient amount of deflection electrons while maintaining the vacuum condition.

In addition, after the vacuum seal valve mechanism switches to the vacuum seal condition, the electron beam irradiation means is moved. After switching to the electron beam irradiation state, exposure is carried out. Specifically, the static pressure floating pad 28 sticks to the master disk 11 in a contactless manner with a gap of approximately 5 µm, wherein the master disk 11 is irradiated, in focus, with the electron beam b emitted from the electron gun 26 through the electron beam passage 29 in the center of the static pressure floating pad 28. Further, rotational movement by the above-mentioned support mechanism unit 12 and linear movement by the linear guide mechanism 14 allow continuous exposure from the inner periphery to the outer periphery of the master disk 11. In other words, the master disk 11 is irradiated with the electron beam b in a state where part of the surface of the master disk 11 is vacuumized by the static pressure floating pad 28, and, at the same time, the master disk 11 is rotated by the drive force of the spindle motor 20 and the master disk is moved in a radial direction by the drive force of the movable table 18, thus recording information on a predetermined linear track.

According to the above-mentioned preferred embodiments of the present invention, since the deflection electron detector is provided at the lower end of the vacuum seal valve mechanism in the differential static pressure floating pad, the deflection electron detector may approach the master disk, thereby reducing the working distance without damaging the vacuum sealing by the vacuum seal valve mechanism, capturing a sufficient amount of deflection electrons by intensifying the deflection electrons, and accurately detecting the deflection electrons.

Further, a sharp observing image may be obtained, without effects from deflected electrons from deflection electron detection signals detected by the deflection electron detector, so that focusing of the electron beam prior to an exposure and astigmatism adjustment may be easily achieved.

Based on the sharp observing image, it is possible to focus on the right focal point, thereby improving the precision of focusing performed by visual check.

Since a sufficient amount of deflection electrons may be obtained, the diameter of the electron beam b may be reduced to tens of nm, for example, thus increasing the lifetime of the electron gun 26.

In addition, the diameter of the electron beam b may be reduced so that a higher recording density may be achieved by carrying out exposure under a finer pattern with a line width not exceeding hundreds of nm, for example.

In addition, comparing an image obtained by means of secondary electrons having lower energy with an image from deflection electrons having higher energy, as electrons from all directions are easily captured by the detector, a secondary electron image provides a sharp image without shadows, similar to that observed by an optical microscope. Also, as only the deflection electrons in the direction facing the detector are detected, an image may be obtained as in an optical microscope by one-side lighting.

The utilization of the deflection electron signals may provide the following advantages.

Backscattered electrons, i.e., the so-called deflection electrons, may change in amount and in deflecting direction due to composition of the specimen, surface roughness, crystallinity, magnetic properties, etc. Firstly, the deflection electron generating efficiency that depends on a mean atomic number of the specimen, secondly, the angle dependency of the deflection electrons at a surface of the specimen, and, thirdly, the deflection electron intensity when an angle of incidence of an incident electron ray over a crystalline specimen contribute to the contrast of a deflection electron image.

In addition, along with differences in composition among specimens, the surfaces of the specimens are uneven. In order to separate the two, information based on the composition and the unevenness for a deflection electron image, semiconductor detectors are provided in a symmetric position in relation to an axis of the incident electron beam so that detected signals are each electrically computed for the separation. The sum of the detected signals provides a composite image, and subtraction or a difference of the detected signals provides a rugged image. As to the composite image, for a crystalline specimen, inclination of the crystal widely changes the intensity of the deflection electrons approximately around the Bragg's condition, so that a difference in crystal orientation is captured as a so-called channeling contrast.

An area where the deflection electrons are generated is larger than that an area where the secondary electrons are generated and has tens of nm, consequently having a reduced spatial resolution. However, the area has high energy, so it is less subject to an electrostatic charge and the influence of contamination of the specimen.

In the above-mentioned preferred embodiments of the present invention, semiconductor detectors 40A, 40B are exemplified as being provided divided in two; however, the preferred embodiment is not limited to such example, so that a semiconductor detector separated in four 40A, 40B, 40C and 40D may be disposed to be applied to the electron beam irradiation apparatus for preparing the master disk or the scanning electron microscope (SEM).

It should be pointed out that the present invention is not limited to the above-mentioned embodiments and may be applied to other embodiments. It is therefore to be understood by those of ordinary skill in the art that any changes, variations, combinations and sub-combinations may be practiced otherwise than as specifically described herein without departing from the scope and spirit of the present invention.

What is claimed is:

1. A detection apparatus including an electron beam irradiation head for permitting electron beam irradiation upon maintaining a position having a microscopic gap facing a recording medium; a securing and disposing means for securing and disposing said electron beam irradiation head emitting the electron beam by rendering said recording medium under partial vacuum; a movement means for moving said recording medium in a radial direction, a rotation means for rotating said recording medium when mounted on said movement means; a support means for horizontally mounting and supporting said recording medium when mounted on a rotating shaft of said rotation means; a focus table provided on a side of said support means for focusing said electron beam; a focus adjusting means for making a focus of said electron beam adjustable against said recording medium with said electron beam irradiation head opposing said focus table; and a static pressure floating pad provided in an electron beam passage on an end of said electron beam irradiation head; said detection apparatus detecting a signal for focusing according to a change of shape or material of a surface of said recording medium caused by electron beam irradiation upon using said focus adjusting means, when linearly recording information on said recording medium supported to be movable in a rotational direction and in a radial direction; wherein said detection apparatus comprises:

a vacuum seal switching means for switching between an electron beam irradiation state and a vacuum seal state by opening/closing said electron beam passage with a piston, said switching means provided in said static pressure floating pad; and a deflection electron detection means for detecting a deflection electron signal generated from said recording medium due to said electron beam irradiation, said detection means provided between said vacuum seal switching means and said recording medium.

2. The detection apparatus according to claim 1, wherein said deflection electron detection means is provided with a cover for covering a coating portion of a signal wire for extracting said detected deflection electron signal.

3. The detection apparatus according to claim 1, further comprising a terminal for connecting said signal wire for extracting said deflection electron signal detected by said deflection electron detection means to said signal processing means located outside of said static pressure floating pad, while maintaining vacuum in said static pressure floating pad.

4. A detection method utilizing an electron beam irradiation head for permitting electron beam irradiation upon maintaining a position having a microscopic gap facing a recording medium; a securing and disposing means for securing and disposing said electron beam irradiation head emitting the electron beam by rendering said recording medium under partial vacuum; a movement means for moving said recording medium in a radial direction, a rotation means for rotating said recording medium when mounted on said movement means; a support means for horizontally mounting and supporting said recording medium when mounted on a rotating shaft of said rotation means; a focus table provided on a side of said support means for focusing said electron beam; a focus adjusting means for making a focus of said electron beam adjustable against said recording medium with said electron beam irradiation head opposing said focus table; and a static pressure floating pad provided in an electron beam passage on an end of said electron beam irradiation head; said detection method detecting a signal for focusing according to a change of shape or material of a surface of said recording medium caused by electron beam irradiation upon using said focus adjusting means, when linearly recording information on said recording medium supported to be movable in a rotational direction and in a radial direction; wherein said detection method comprises:

a vacuum seal switching step of switching between an electron beam irradiation state and a vacuum seal state by opening/closing said electron beam passage with a piston, said switching step provided in said static pressure floating pad; and a deflection electron detection step of detecting a deflection electron signal generated from said recording medium due to said electron beam irradiation, said detection step provided between said vacuum seal switching step and said recording medium.

5. The method according to claim 4, wherein said detection in said deflection electron detecting step is carried out after the vacuum seal state is switched to the electron beam irradiation state by said vacuum seal switching step.

6. An electron beam irradiation apparatus including an electron beam irradiation head for permitting electron beam irradiation upon maintaining a position having a microscopic gap facing a recording medium; a securing and disposing means for securing and disposing said electron beam irradiation head emitting the electron beam by rendering said recording medium under partial vacuum; a movement means for moving said recording medium in a radial direction, a rotation means for rotating said recording medium when mounted on said movement means; a support means for horizontally mounting and supporting said recording medium when mounted on a rotating shaft of said rotation means; a focus table provided on a side of said support means for adjusting a height of said electron beam irradiation head and focusing said electron beam; a focus adjusting means for making a focus of said electron beam adjustable against said recording medium with said electron beam irradiation head opposing said focus table; and a static pressure floating pad provided in an electron beam passage on an end of said electron beam irradiation head; said apparatus detecting a signal for focusing according to a change of shape or material of a surface of said recording medium caused by electron beam irradiation upon using said focus adjusting means, when linearly recording information on said recording medium supported to be movable in a rotational direction and in a radial direction; wherein said electron beam irradiation apparatus comprises:

a vacuum seal switching means for switching between an electron beam irradiation state and a vacuum seal state by opening/closing said electron beam passage with a piston, said switching means provided in said static pressure floating pad; and a deflection electron detection means for detecting a deflection electron signal generated from said recording medium due to said electron beam irradiation, said detection means provided between said vacuum seal switching means and said recording medium.

7. The electron beam irradiation apparatus according to claim 6, wherein said deflection electron detection means is provided with a cover for covering a coating portion of a signal wire for extracting said detected deflection electron signal.

8. The electron beam irradiation apparatus according to claim 6, further comprising a terminal for connecting said signal wire for extracting said deflection electron signal detected by said deflection electron detection means to said signal processing means located outside of said static pressure floating pad, while maintaining vacuum in said static pressure floating pad.

9. The electron beam irradiation apparatus according to claim 6, wherein said recording medium comprises a master of an optical disk.

* * * * *